WITNESSES
Edwin E. Bassler
James F. Young

INVENTORS
Melbourne J. Hellstrom &
Charles H. Wood, Jr.
BY
Benjamin DeWitt
ATTORNEY United States Patent Office 3,111,602 Patented Nov. 19, 1963

3,111,602
DEFLECTION CIRCUITS

Melbourne J. Hellstrom, Watchung, N.J., and Charles H. Wood, Jr., Glen Burnie, Md., assignors to Westinghouse Electric Corporation, East Pittsburgh, Pa., a corporation of Pennsylvania Filed Apr. 14, 1959, Ser. No. 806,352
5 Claims. (Cl. 315—27)

This invention relates to cathode ray deflection systems and more particularly to waveform generating circuits for providing either a voltage or a current having a sawtooth wave form.

In deflection systems requiring application of sawtooth current waves to cathode ray tube deflection yoke windings, it is desirable to prohibit direct current flow through the yoke windings. It is conventional practice to provide a coupling network between the waveform generator or amplifier and the deflection yoke, which network blocks flow of direct current to the yoke. Such networks may take various known forms and may include various inductive coupling devices such as an autotransformer, a coupling inductor or a multiwinding transformer.

All such coupling devices and coupling networks present a common problem in that they all introduce distortion of the waveform. Even the best transformers and coupling inductors present a magnetizing inductance which results in appreciable waveform distortion. Specifically, the usual effect is such that when a perfect sawtooth current wave is impressed upon the device or transformer which couples to an essentially resistive load, the sawtooth current or voltage valve appearing at its output terminals and in the load, is curved or bent over so that as the amplitude of the sawtooth ramp portion increases, its rate of change progressively decreases. Efforts to alleviate the foregoing problem by increasing the coupling inductance are complicated and frustrated by the necessity of minimizing the direct current resistance of the coupling device. Excessive direct current resistance would result in loss of voltage aperture in the amplifier output stage with a corresponding loss of gain, and loss of maximum output signal amplitude.

In addition to the distortion introduced by the foregoing reactive output networks, an additional source of distortion is found in deflection systems utilizing semiconductor amplifier devices. Power transistor devices of the type required in the deflection output stage are generally characterized by a falling current gain characteristic such that the amplification factor at high signal amplitudes is substantially smaller than at low signal levels. Specifically, the effect of such a nonlinear transconductance is that when a sawtooth wave having a perfectly linear ramp portion is applied to the transistor input circuit, the sawtooth current wave at its output will be distorted in much the same manner as such a waveform would be distorted by an inductive output circuit.

Accordingly, a primary feature of this invention is that it provides a sweep circuit for energizing a deflection yoke of a cathode ray tube in which circuit a source of sawtooth waveform signals is connected to the input circuit of an electronic amplifier which has an output circuit for energizing the yoke. The sweep circuit further includes a feedback network in which the yoke current is sampled and a signal representative of said yoke current is applied to an input of said amplifier in such a phase that it constitutes negative feedback and corrects for the aforementioned types of distortion which would otherwise occur in the system.

An object of this invention is to provide an improved cathode ray tube deflection system.

A further object of this invention is to provide an improved means for supplying a cathode ray deflection field of sawtooth wave form having a substantially linear ramp portion.

An additional object of this invention is to provide an improved deflection circuit in which a substantially linear sawtooth current wave may be obtained from the output circuit of a reactive coupling network.

A still further object of the present invention is to provide a deflection system in which a substantially linear sawtooth deflection field may be obtained from amplifier means having a nonlinear transconductance characteristic.

Another feature of this invention is that it provides an electronic oscillator comprising a charging circuit connected through an electronic amplifier to a load inductance, and connected to an electronic switch which is also connected through a regenerative feedback circuit to the load inductance. During one portion of a cycle of operation, the switch, and therefore, the feedback circuit is open, and the charging circuit, through the amplifier, controls the energy to the load inductance. When the gradually-changing portion of the waveform developed by the charging circuit reaches a predetermined level, the electronic switch closes and regeneration is initiated in the feedback circuit. During the regenerative portion of the cycle, the charging circuit is restored in its initial condition. At the end of the regenerative portion of the cycle, the feedback controlling switch is opened, and the charging circuit again takes control of the open-switch portion of the cycle. During the regenerative portion of the cycle energy stored in the load inductance during the charging portion of the cycle is used to alter the level of the charge in the charging circuit. More specifically, a portion of the energy which was stored in the load inductance during the charging cycle is used, during the regenerative cycle portion, to restore the charging circuit to its initial condition. In certain embodiments of the invention the charging circuit may be discharged to zero voltage during the regenerative interval. In other embodiments within the scope of the invention, it is contemplated that the regenerative feedback circuit will operate to materially change the level of the charge in the charging circuit without necessarily leaving it at zero charge.

Another feature of this invention is that it provides a in which a sweep capacitor is connected to the input circuit sweep circuit for a deflection yoke of a television receiver, of an electronic amplifier having its output circuit connected to the deflection yoke. The sweep capacitor is charged slowly to provide a ramp portion of the sweep waveform. An electronic switch which is open while the sweep capacitor is being charged, and which is closed when the sweep capacitor has been charged to a predetermined level is connected in a regenerative feedback loop including the yoke, to the sweep capacitor. At the end of the sweep, the switch is closed, and energy stored in the yoke during the ramp portion of the sweep charges the sweep capacitor in the direction opposite to that in which it was charged and effects retrace.

Another feature of this invention is that it provides a sweep circuit for a deflection yoke of a television receiver in which positive feedback is used to improve linearity.

Accordingly, another object of this invention is to provide a waveform generating network for energizing a load inductance which network includes a charging circuit and in which reactive energy stored in the load inductance is used to alter the charge in the charging circuit.

Another object of this invention is to use energy stored in a deflection yoke of a cathode ray tube during sweeps, to discharge a sweep capacitor to the level that exists at the time the sweeps originate to thereby affect retrace.

Another object of this invention is to use positive feedback in a cathode ray deflection circuit, to improve linearity.

Another object of this invention is to sample the yoke current of a cathode ray deflection yoke coupled to an electronic amplifier, to derive a negative feedback signal from the sampled current, and to apply the feedback signal to an input circuit of the amplifier for correcting for distortion which would otherwise occur as a result of unavoidable characteristics of the amplifier and its output circuit.

These and other objects and advantages of the present invention will become apparent from the following description taken in accordance with the accompanying drawing which forms a part of this application and in which.

In accordance with a preferred form, the present invention provides circuit means for generating a voltage wave having a substantially linear sawtooth waveform. That voltage wave is applied to an input circuit of an electronic amplifier which preferably but not necessarily includes one or more semiconductor amplifier devices. Simultaneously, there is applied to another input circuit of the amplifier a negative feedback signal derived from the amplifier output circuit which signal is representative of the deflection field waveform as produced by the system. The negative feedback signal modifies the composite input to the amplifier in a manner to compensate for distortion produced by the reactances of the output network and other nonlinear circuit characteristics. As a result of such compensation, the deflection current wave produced by the output network is maintained substantially linear during the deflection interval. The input sawtooth voltage may be generated by any suitable circuit. In the preferred embodiment illustrated, the means for producing the input sawtooth voltage comprises an oscillatory semiconductor circuit of the general type described and claimed in copending application Serial No. 803,895, filed April 3, 1959, by M. J. Hellstrom and assigned to the same assignee as this application.

Figure 1:
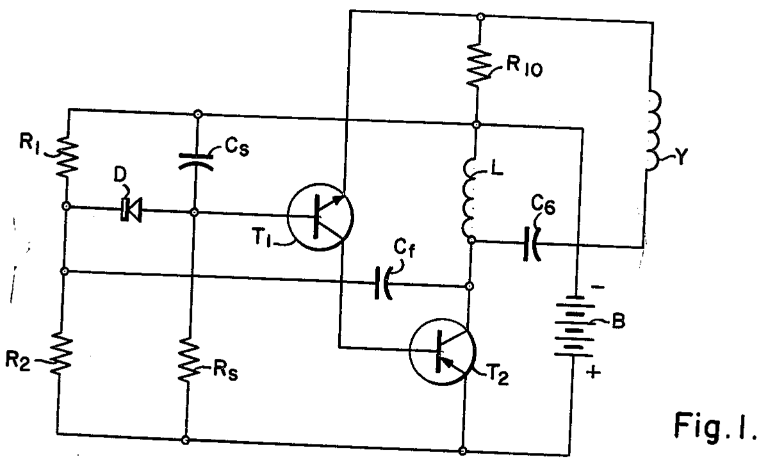
FIGURE 1 is a simplified circuit diagram of a sawtooth waveform generating circuit embodying certain features of this invention.

More particularly and with reference first to FIG. 1, a sweep capacitor $C_s$ is connected in series with a sweep resistor $R_s$ across battery B. Diode switch D has its cathode connected to the junction of voltage divider resistors $R_1$ and $R_2$ which are connected in series across the battery B. The anode of the diode switch D is connected to the junction of the capacitor $C_s$ and the resistor $R_s$, which junction is also connected to the base of NPN driver transistor $T_1$. The emitter electrode of the transistor $T_1$ is connected through a feedback resistor $R_{10}$ to the negative terminal of the voltage source B, and the collector electrode of $T_1$ is connected to the base of PNP output transistor $T_2$. The collector electrode of transistor $T_2$ is connected through an output coupling inductor L to the negative terminal of voltage source B.

While the coupling impedance L is shown schematically as a simple inductor, it may comprise either a choke, an autotransformer or a multiple winding transformer, such conventional variations being within the scope of this invention. A second impedance Y which may be the vertical deflection winding of a cathode ray tube yoke is connected serially with coupling capacitor $C_6$ and feedback resistor $R_{10}$ to the end terminals of inductor L. The emitter electrode of the transistor $T_2$ is connected to the positive terminal of the battery B. A feedback capacitor $C_f$ connects the junction point of the inductor L and the collector of the transistor $T_2$ with the junction of the resistors $R_1$ and $R_2$ and the cathode of diode switch D.

Figure 3:
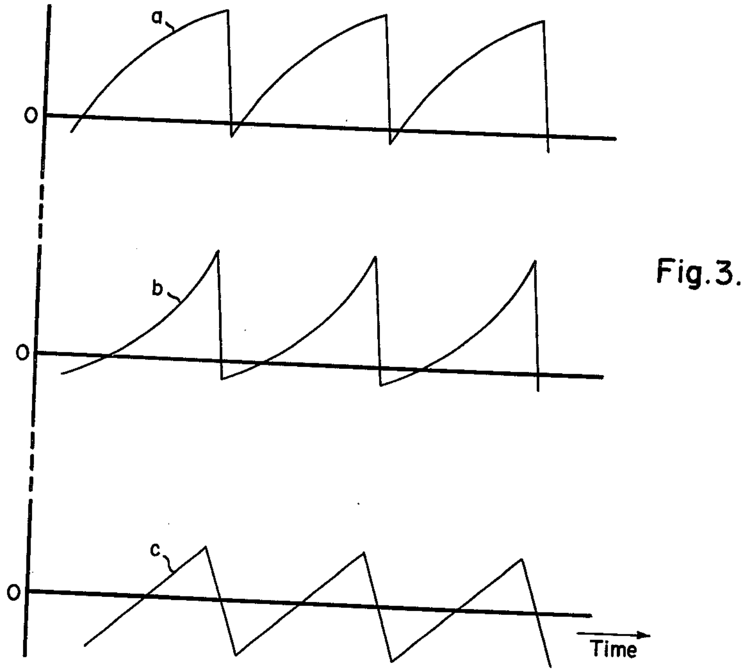
FIG. 3 illustrates certain voltage and current waveforms referred to in explaining the present invention.

In the operation of the circuit of FIG. 1, the sweep capacitor $C_s$ functions as a means for generating a sawtooth voltage wave, which wave includes a first portion of gradually changing amplitude in one direction occurring during a deflection interval and further includes a second portion of rapidly changing amplitude in the opposite direction occurring during a retrace interval of time. The gradually changing part of the voltage wave may conveniently be referred to as the "ramp portion" of the sawtooth. The rapidly changing portion is conventionally designated as the flyback portion. A typical sawtooth waveform as developed across the plates of capacitor $C_s$ is illustrated by curve "*a*" in FIG. 3, which curve represents a plot of voltage as a function of time.

The ramp portion of the wave is developed by capacitor $C_s$ charging through resistor $R_s$ toward the potential level of battery B. The flyback portion of the wave is produced by rapid change of the capacitor charge in the opposite direction in response to flyback voltage applied through capacitor $C_f$ and diode D, in a manner to be more fully described hereinafter. It is to be noted that capacitor $C_s$ is not simply discharged during the flyback interval, but rather is charged in the opposite direction through zero charge and to a negative charge level as indicated at the beginning of the ramp portion of waveform "*a*" in FIG. 3. The voltage across the sweep capacitor $C_s$ during the charging portion of a cycle, is less than the voltage across the resistor $R_1$, hence the diode switch D is open (does not conduct). The gradually increasing voltage across the sweep capacitor $C_s$ is applied to the base of the driver transistor $T_1$, providing an increasing base current in the transistor $T_1$ which is amplified in $T_1$ to become an increasing collector current in $T_1$. This increasing collector current in $T_1$ applied to the base of the output transistor $T_2$ causes its collector current and the current in the load Y to increase. During this sweep portion of a cycle, the circuit operates substantially as a direct current amplifier of the gradually changing ramp voltage appearing across capacitor $C_s$ and applied to the base electrode of transistor $T_1$.

When the voltage across the sweep capacitor $C_s$ reaches the predetermined level set by the voltage divider $R_1$–$R_2$, the diode switch D closes (conducts), and connects a positive feedback path from the collector of $T_2$, through the feedback capacitor $C_f$ and diode D to the base of the driver transistor $T_1$ starting an oscillation involving the energy in and the inductance of load Y and the capacitances of the capacitors $C_s$ and $C_f$ in a tuned oscillatory circuit. Initially, the current flow is through the diode D in a forward direction and in capacitor $C_s$ in the direction opposite to that which initially charged the capacitor $C_s$. The latter discharges very quickly (or more accurately charges in the opposite direction as shown by the flyback portion of curve "*a*" in FIG. 3) until the diode D opens up which occurs when the oscillatory current attempts to reverse its polarity at the end of the flyback part of the cycle. After the diode D opens, the circuit again operates substantially as a direct current amplifier during the deflection interval. Any excess voltage in the capacitor $C_f$ leaks off through the resistors $R_1$ and $R_2$. The sweep capacitor $C_s$ again charges through the sweep resistor $R_s$ to repeat the sweep portion of the cycle. During the period of gradual change of output current from transistor $T_2$, inductive energy is stored primarily in the inductance of yoke Y.

Since capacitor $C_s$ is connected in series with resistor $R_{10}$ between the emitter and base electrodes of $T_1$ the voltage appearing across resistor $R_{10}$ will be combined with the voltage from capacitor $C_s$ to provide a composite input signal to transistor $T_1$. Thus resistor $R_{10}$, together with its connections to transistor $T_1$, forms a negative feedback circuit for deriving a signal representative of yoke current amplitude, which signal is applied to the emitter electrode of transistor $T_1$ in a phase such that it compensates for distortion in the system. Specifically, the composite input voltage applied between the emitter and base electrodes of transistor $T_1$ has an upward curvature substantially as shown by curve "*b*" in FIG. 3. Preferably, the curvature of the composite input signal waveform is made sufficient so that it compensates for nonlinearities in the transconductance of transistor $T_2$ and further compensates at least in part for the distortion caused by the reactance of the output network including inductor L, yoke Y and coupling capacitor $C_6$.

Figure 2:
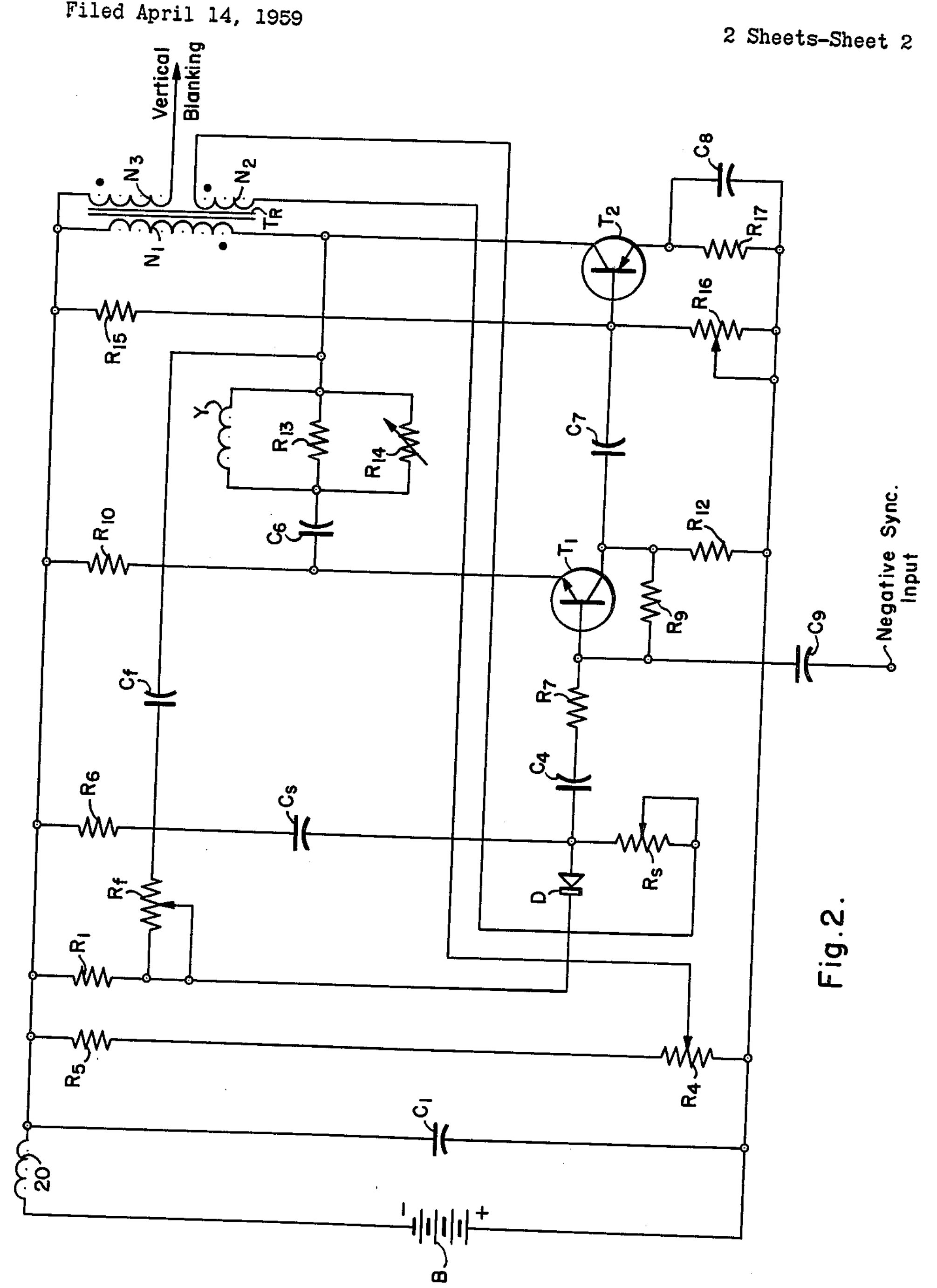
FIG. 2 is a schematic diagram of a cathode ray deflection system of a television receiver embodying this invention.

By virtue of the negative feedback from $R_{10}$ to the input circuit of transistor $T_1$, the collector current of transistor $T_2$ may be caused to have a ramp portion curvature such that the current coupled to yoke Y varies in a substantially linear manner. The waveform of the current in deflection yoke Y is illustrated by curve "c" in FIG. 3. While a simple and preferred form of the feedback circuit is shown in FIGS. 1 and 2 as comprising the resistor $R_{10}$ connected serially with yoke Y across the terminals of coupling inductor L and windings $N_1$, respectively, it will be apparent to persons skilled in the art that various other circuit arrangements may be used for deriving a signal representative of the deflection current waveform. Such other variant circuits as become apparent to persons skilled in electronics are within the scope of this invention.

Referring now to FIG. 2 where components common to both FIGS. 1 and 2 are given the same reference characters, a filter choke 20 and a filter capacitor $C_1$ are connected in series across the voltage source battery B and serve as an LC filter to keep noise from other sections of a television receiver out of the vertical deflection system of FIG. 2. Voltage divider resistors $R_4$ and $R_5$ are connected in series across the voltage source B. The resistor $R_4$ in this embodiment of the invention is a potentiometer so that it can act as a linearity control. Sweep capacitor $C_s$ is connected in series with resistor $R_6$, sweep resistor $R_s$, and positive feedback winding $N_2$ of output transformer $T_R$ to the adjustable brush of the resistor $R_4$. The resistor potentiometer $R_s$ controls the charging time constant and hence the frequency of oscillation, and the resistor potentiometer $R_4$ controls linearity.

The potentiometer or adjustable resistor $R_s$ controls the RC constant of the charging network comprising $C_s$, $R_s$, $R_5$, $R_6$ and $R_4$. Thus, adjustment of resistor $R_s$ controls the charging time constant and hence the frequency of the system. Resistor $R_4$ serves as a linearity control by enabling adjustment of the relative amplitudes of sawtooth ramp and parabolic component developed across capacitor $C_s$ during the charging interval. The parabolic component is generated by integration, in capacitor $C_s$, of the voltage ramp appearing across winding $N_2$. The feedback winding $N_2$ is connected serially between the adjustable tap or brush of resistor $R_s$ and the brush of resistor $R_4$.

Resistor $R_6$ is connected serially with capacitor $C_s$, diode switch D, resistor $R_f$ and feedback capacitor $C_f$ in a regenerative feedback loop across winding $N_1$ thereby limiting the shunting effect of $C_s$ on the signal at the base of $T_1$ at high frequencies. The use of resistor $R_6$ enables increased gain at high frequencies to thereby improve the regenerative action and ease of synchronization. The voltage divider formed by resistors $R_4$ and $R_5$ provides an adjustable reference voltage level at the brush of resistor $R_4$, toward which level capacitor $C_s$ charges during the deflection interval. Adjustment of $R_4$ determines the amount of D.C. voltage applied across $R_s$ and $C_s$ relative to the amount of positive feedback voltage from winding $N_2$.

The junction of sweep resistor $R_s$ and the sweep capacitor $C_s$ is connected to the anode of diode switch D, and through coupling capacitor $C_4$ and resistor $R_7$ to the base of the NPN driver transistor $T_1$. The base of the driver transistor is also connected through resistor $R_9$ to its collector which is connected through resistor $R_{12}$ to the positive side of the voltage source B. Resistors $R_9$ and $R_{12}$ provide bias for $T_1$ to ensure against deleterious effects of thermal variations and slight differences in the characteristics of different transistors.

The emitter of the transistor $T_1$ is connected through resistor $R_{10}$ and through choke 20 to the negative side of the voltage source B, and through blocking capacitor $C_6$ to one end terminal of vertical deflection yoke Y. The other end terminal of the yoke Y is connected to one end of primary winding $N_1$ of the transformer $T_R$, the other end of which is connected through choke 20 to the negative side of the battery B. A damping resistor $R_{13}$ and a clamping varistor $R_{14}$ are shunted across the yoke Y. Varistor $R_{14}$ is a nonlinear resistance device which becomes more conductive at higher voltages thereby operating as a damper to prevent the application of excessively high voltage flyback pulses from yoke Y to the collector of transistor $T_2$. The use of varistor $R_{14}$ enables transistors of lower voltage rating to be used in the output stage.

The collector of the driver transistor $T_1$ is connected through coupling capacitor $C_7$ to the base of PNP output transistor $T_2$, the collector of which is connected to one end terminal of the transformer winding $N_1$, and to yoke Y. Alternatively winding $N_1$ may be provided with an intermediate tap or terminal with the collector electrode of transistor $T_2$ being connected thereto and yoke Y being connected to the end terminal, if impedance matching is desired between the collector circuit and the yoke. Likewise, it is to be understood than transformer $T_R$ may be provided with separate windings for connection to the yoke Y and the output stage collector circuit respectively. In that case, the blocking capacitor $C_6$ would be eliminated and the additional transformer winding would be connected directly across the yoke Y thereby isolating the yoke from the D.C. current paths of the system. The emitter of the output transistor $T_2$ is connected through bias resistor $R_{17}$ which is shunted by bypass capacitor $C_8$, to the positive side of the battery B. The base of the output transistor $T_2$ is also connected through bias divider resistor $R_{15}$ and choke 20 to the negative side of the battery B, and through adjustable bias divider resistor $R_{16}$ to the positive side of the battery. Winding $N_3$ of the transformer $T_R$ is connected at one end to the negative side of the battery B, and is connected at its other end to a conventional vertical blanking circuit (not shown) for applying cutoff bias to the cathode ray tube during the retrace interval.

The yoke Y is connected through feedback capacitor $C_f$ and feedback resistor $R_f$ to the cathode of the diode D, which also is connected through resistor $R_1$ and choke 20 to the negative side of the battery B.

The circuit as illustrated in FIG. 2 is particularly adapted for use as the vertical deflection wave generator of an otherwise conventional television receiver. Conventional negative going synchronizing signals may be applied from the television receiver synchronizing signal separator (not shown) through coupling capacitor $C_9$ to the driver transistor $T_1$. It is to be understood that the deflection oscillator system of the present invention also may be synchronized by positive going synchronizing pulses applied either to the base of the output transistor $T_2$ or to the base of the input transistor if a PNP input stage is used.

The black dots at the ends of the windings of the transformer $T_R$ indicate ends having the same polarity.

Since A.C. coupling to the yoke Y is desired, D.C. isolation is provided by the blocking capacitor $C_6$ which couples the series combination of resistor $R_{10}$ and the yoke Y in shunt with winding $N_1$ for A.C. signals. Winding $N_1$ provides a current path from the collector to battery B for the D.C. component of collector current.

The resistor $R_{10}$ samples the yoke current and develops a negative feedback voltage which is applied to the emitter of the driver transistor $T_1$. As stated heretofore in relation to FIG. 1, this negative feedback dynamically modifies the emitter to base voltage of transistor $T_1$ so that the sawtooth signal applied to transistor $T_2$ has sufficient curvature to substantially correct for output waveform nonlinearities which otherwise would result from nonlinear transistor characteristics and the inductive nature of the coupling winding $N_1$.

The negative feedback does not reduce the nonlinearity inherent in the $R_sC_s$ sawtooth generating circuit. For this reason, and to further reduce the overall distortion, some shaping of the waveform applied to the base of the driver transistor $T_1$ is provided by using positive feedback during sweep periods, applied through the winding $N_2$ which is coupled to the winding $N_1$. The output sawtooth applied through the feedback winding $N_2$ is integrated by the sweep resistance and capacitance to provide a parabolic component of voltage across the sweep capacitor, thereby correcting for the inherent droop of the exponential capacitor charging curve.

In the operation of FIG. 2, the sweep capacitor $C_s$ is charged during the charging portion of the cycle by current flow from the positive terminal of battery B through a portion of resistor $R_4$, through winding $N_2$, resistor $R_s$, capacitor $C_s$, and resistor $R_6$ back to the negative terminal of the battery. More exactly, the charging resistance includes $R_6$, $R_s$ and the combination of resistor $R_5$ plus the upper portion of resistor $R_4$ in parallel with the lower portion of $R_4$. The voltage applied to the charging circuit for charging $C_s$ is, accordingly, a portion of the battery voltage as determined by the adjustment of $R_4$ plus a sawtooth component from winding $N_2$. The rising voltage across the sweep capacitor $C_s$ is applied to the base of the transistor $T_1$, providing an increasing collector current in the transistor $T_1$ which, applied to the base of the output transistor $T_2$, causes its collector current, and hence the current in the yoke Y to increase.

At the beginning of the charging interval the cathode of diode D is positive in relation to its anode because of the minimum charge condition of capacitor $C_s$. "Minimum charge condition" is to be understood as meaning the most negative potential of the lower terminal of capacitor $C_s$ relative to its upper terminal regardless of whether the capacitor is actually charged in one polarity or the other. As current flows to the lower plate of capacitor $C_s$ from resistor $R_s$, the anode of diode D goes in a positive direction relative to its cathode. When the charge condition of capacitor $C_s$ becomes such that diode switch D is forwardly biased the diode conducts, thereby completing a regenerative feedback path which may be traced as follows: a signal developed across the yoke Y the resistor $R_{10}$ and the capacitor $C_6$ in series, (and across the elements in parallel with the yoke such as the resistors $R_{13}$ and $R_{14}$) and across the transformer winding $N_1$, is coupled through the capacitor $C_f$ and the resistor $R_f$ in series to the resistor $R_1$, and then through the diode D which is conducting at this time, to the capacitor $C_s$ and the resistor $R_6$ in series. The resistor $R_s$, the linearity winding $N_2$ and the resistance seen at the brush of resistor $R_4$ are effectively in shunt with the $R_6$–$C_s$ combination, but their effect is small, and of no essential importance during the regenerative portion of the cycle. Resistance $R_f$ is adjustable to control the effectiveness of the regenerative portion of the cycle in discharging the sweep capacitor $C_f$. Therefore, it serves as an amplitude control.

From capacitor $C_s$ the signal is coupled through capacitor $C_4$ and resistor $R_7$ to the base of driver transistor $T_1$. The signal is amplified in the latter and applied through the coupling capacitor $C_7$ to the base of output transistor $T_2$. The signal after further amplification by the output transistor $T_2$ is developed across the yoke Y, capacitor $C_6$ and resistor $R_{10}$ in series in such a phase as to sustain oscillation in the usual regenerative manner. This action ceases when the polarity of the current in the diode attempts to reverse opening the diode and hence the regenerative loop.

In application of the circuit of FIG. 2 for cathode ray deflection, retrace takes place during the above-described regenerative portion of the cycle. Rapid retrace is enabled by using the reactive energy stored in winding $N_1$ and the yoke Y to rapidly alter the charge on the charging capacitor $C_s$. The inverse voltage or "flyback" appearing across the yoke Y when transistor $T_2$ is cutoff drives current through $C_6$ and $R_{10}$, in series and thence through capacitor $C_s$, diode D, resistor $R_f$ and capacitor $C_f$ back to the yoke winding. This current flow may remove substantially all charge from $C_s$ or in certain embodiments within the invention may leave the lower plate of capacitor $C_s$ charged negative relative to the upper plate. The foregoing flow of current in the forward direction through diode D discharges the capacitor $C_s$ very quickly providing rapid reconditioning of the charging circuit for the next sweep interval. It is to be noted that no active elements such as tubes or transistors are included in the high current discharge path. When the oscillatory current through the discharge loop attempts to reverse its direction due to the tuned circuit comprising yoke Y, and capacitors $C_s$ and $C_f$ the diode switch D becomes an open circuit and the system begins the substantially linear gradual charging interval with capacitor $C_s$ being again charged by current flow through $R_s$ as heretofore described.

Using a driver stage ahead of the output transistor enables a smaller sweep capacitor to be used than in circuits in which the charging capacitor drives the deflection output stage directly. In the latter type circuits, the driver device is used to discharge a large sweep capacitor, and hence the driver device in such circuits must have an appreciably greater power rating than in the various embodiments of the present invention.

It is to be understood that in each of the foregoing embodiments, other forms of an electronic switch such as a transistor could, of course, be used instead of the diode switch D. Likewise, while a NPN driver and a PNP output transistor have been used in the circuits of FIGS. 1 and 2, other combinations of transistors, tubes, or tubes and transistors or a single tube or transistor could be used without departure from the spirit of the invention.

In a particular constructed embodiment of the present invention, the following circuit parameters were found to be preferable for use in the circuit of FIG. 2:

| | |
|---|---|
| Capacitor $C_s$ | 14 microfarads. |
| Capacitor $C_f$ | 1.0 microfarads. |
| Capacitor $C_6$ | 2000 microfarads. |
| Capacitor $C_7$ | 25 microfarads. |
| Resistor $R_1$ | 1.8 kilohms. |
| Resistor $R_6$ | 56 ohms. |
| Resistor $R_7$ | 330 ohms. |
| Resistor $R_{10}$ | 3.3 ohms. |
| Transistor $T_1$ | Sylvania type 2N214. |
| Transistor $T_2$ | Bendix type 2N418. |

It is to be understood, of course, that these values are given merely by way of example and are not intended to limit the invention in any way.

While the present invention has been shown in certain preferred forms only, it will be understood by persons skilled in the art that it is not limited to the illustrated embodiments but is susceptible of various changes and modifications without departing from the spirit and scope thereof.

We claim as our invention:

1. A sweep circuit for a television receiver comprising means for generating a sawtooth voltage wave including ramp portions of gradually changing amplitude occurring during deflection intervals and flyback portions of rapidly changing amplitude occurring during retrace intervals, amplifier means including at least one transistor having an input circuit including first and second input electrodes, an output electrode, an output circuit coupled to said output electrode, means for coupling said sawtooth voltage between said first input electrodes and a point of reference potential, a deflection yoke for the picture tube of said receiver, said yoke coupled with said output circuit and through which it is desired to pass a sawtooth current wave having a substantially linear ramp portion, said output circuit having a composite impedance characteristic which tends to cause distortion and nonlinearity in the sawtooth current waves applied therefrom to said deflection coil, negative feedback means coupled to said output circuit for deriving a feedback signal which varies as a function of current flow in said deflection yoke and means connected between said feedback means and said transistor for coupling said feedback signal between said second input electrode and said point of reference potential to modify the composite signal input to said amplifier so that said composite signal input has a ramp portion which is curved sufficiently and in the proper direction to compensate for the distortion caused by said output circuit whereby substantially linear sawtooth deflection is produced.

2. A sweep circuit for a television receiver comprising means for generating a sawtooth voltage wave including ramp portions of gradually changing amplitude occurring during deflection intervals and flyback portions of rapidly changing amplitude occurring during retrace intervals, amplifier means including a transistor having emitter, base and collector electrodes, circuit means for coupling said sawtooth voltage wave between said base electrode and a point of reference potential, a deflection yoke for the picture tube of said receiver through which it is desired to pass a sawtooth current wave having a substantially linear ramp portion, an output amplifier stage having a signal input circuit coupled to said collector electrode and having a signal output circuit including a transformer for applying alternating current components of signals translated by said amplifier stage to said deflection yoke, said output amplifier stage having a nonlinear signal translation characteristic such that it causes an undesired curvature of the ramp portion of said sawtooth current wave, impedance means connected serially with said deflection yoke and the output terminals of said transformer for deriving a negative feedback signal corresponding to instantaneous amplitude values of the sawtooth current wave passing through said coil, and circuit means connected between said impedance means and said transistor for applying said negative feedback signal between said emitter electrode and said point of reference potential for dynamically modifying the sawtooth input signal applied to said output amplifier stage in a manner such that said last-mentioned sawtooth input signal has a ramp portion which is curved sufficiently and in the right direction to substantially compensate for the undesired distortion caused by said amplifier stage to thereby produce a substantially linear sawtooth deflection current wave.

3. A sweep circuit for a television receiver comprising a sweep capacitor, means for gradually changing the charge of said capacitor from a first level to a second level during deflection intervals, a deflection yoke for the picture tube of said receiver, an electronic amplifier including an output transistor having an input, an output and a third electrode and having an output circuit including said yoke, means connected to said output circuit and to an input circuit of said electronic amplifier for developing a negative feedback voltage which is proportional to the current flowing in said yoke for applying said voltage to said input circuit to distort the output voltage waveform of said amplifier sufficiently and in the right direction during said deflection intervals to offset that distortion of the yoke current waveform which would otherwise occur, an electronic switch means connected to said capacitor, said switch means being open while said first-mentioned means is changing the charge of said capacitor and being closed when said first-mentioned means has charged said capacitor to said second level, and a regenerative feedback loop including said yoke, said capacitor and said switch for supplying energy from said yoke to change the charge of said capacitor from said second level toward said first level during flyback intervals.

4. A sweep circuit for a television receiver comprising a sweep capacitor, means for changing the charge of said capacitor from a first level to a second level, a deflection yoke for the picture tube of said receiver, an electronic amplifier including an input circuit and an output transistor having an output circuit including said yoke, circuit means connected to said output circuit and to said first input circuit of said amplifier for developing a negative feedback signal which increases with an increase of current through said yoke and decreases with a decrease of current through said yoke while said first-mentioned means is changing the charge of said capacitor and for coupling said signal to said input circuit, an electronic switch connected to said capacitor, said switch being open while said first-mentioned means is changing the charge of said capacitar and being closed when said first-mentioned means has charged said capacitor to said second level, a regenerative feedback loop including said yoke, for supplying energy from said yoke to change the charge of said sweep capacitor from said second level toward said first level.

5. A sweep circuit for a television receiver comprising a sweep capacitor, means for changing the charge of said capacitor from a first level to a second level, a deflection yoke for the picture tube of said receiver, an electronic amplifier including first and second input circuits and an output transistor having an output circuit including said yoke, circuit means connected to said yoke and to said first input circuit of said electronic amplifier for developing a negative feedback voltage which increases with an increase of current through said yoke and decreases with a decrease of current through said yoke while said first-mentioned means is changing the charge of said capacitor and applying said voltage to said first input circuit, an electronic switch connected to said capacitor, said switch being open while said first-mentioned means is changing the charge of said capacitor and being closed when said first-mentioned means has charged said capacitor to said second level, a regenerative feedback loop including said yoke, for supplying energy from said yoke to change the charge of said sweep capacitor from said second level toward said first level and a linearity control means connected to said second input circuit and said capacitor charging means, said control means including a positive feedback coil inductively coupled to said output circuit for progressively increasing the rate at which the charge of said sweep capacitor is changed from said first level toward said second level.

References Cited in the file of this patent

UNITED STATES PATENTS

| | | |
|---|---|---|
| 2,602,147 | Cope et al. | July 1, 1952 |
| 2,757,243 | Thomas | July 31, 1956 |
| 2,762,870 | Sziklai | Sept. 11, 1956 |
| 2,814,736 | Hamilton | Nov. 26, 1957 |
| 2,874,311 | Turnage | Feb. 17, 1959 |
| 2,891,192 | Goodrich | June 16, 1959 |
| 2,896,114 | Maloff | July 21, 1959 |
| 2,911,566 | Taylor et al. | Nov. 3, 1959 |
| 2,926,284 | Finkelstein et al. | Feb. 23, 1960 |
| 2,954,504 | Saudinaitis et al. | Sept. 27, 1960 |

FOREIGN PATENTS

| | | |
|---|---|---|
| 446,698 | Italy | Mar. 23, 1949 |